United States Patent [19]

Mittel

[11] Patent Number: 5,057,779
[45] Date of Patent: Oct. 15, 1991

[54] TEMPERATURE INDEPENDENT VOLTAGE MONITOR FOR USE IN A BATTERY OPERATED ELECTRONIC DEVICE

[75] Inventor: James G. Mittel, Boynton Beach, Fla.

[73] Assignee: Motorola, Inc., Schaumburg, Ill.

[21] Appl. No.: 505,218

[22] Filed: Apr. 5, 1990

[51] Int. Cl.$^5$ .............................................. G01N 27/46
[52] U.S. Cl. .................................. 324/431; 324/433; 340/636
[58] Field of Search .................... 324/431, 433, 426; 340/636, 825.44

[56] References Cited

U.S. PATENT DOCUMENTS 3,993,985 11/1976 Chopard et al. ............... 324/431 X
4,660,027 4/1987 Davis ................................... 340/636
4,755,816 7/1988 DeLuca ........................... 340/636 X Primary Examiner—Kenneth A. Wieder
Assistant Examiner—Robert W. Mueller
Attorney, Agent, or Firm—Vincent B. Ingrassia; Thomas G. Berry

[57] ABSTRACT

A voltage potential monitoring circuit is operative to set a voltage potential threshold substantially independent of ambient temperature variation. The monitoring circuit includes a first circuit for generating a first current proportional to the voltage potential being monitored, and a second circuit responsive to the first circuit for generating a second current. The voltage potential threshold is set substantially as a function of the first and second currents. The monitoring circuit further includes a circuit responsive to the first and second currents for generating an undervoltage signal when the monitored voltage potential falls below the set voltage potential threshold. The voltage potential monitoring circuit has application in an electronic device which is operational over an ambient temperature range and includes a source of power for generating a voltage potential suitable for energizing the electronic device.

15 Claims, 3 Drawing Sheets

TEMPERATURE INDEPENDENT VOLTAGE MONITOR FOR USE IN A BATTERY OPERATED ELECTRONIC DEVICE

BACKGROUND OF THE INVENTION

The present invention relates generally to electronic devices which derive their power from a battery source and are sensitive in operation to the voltage potential of the battery derived power source for valid operation, and more particularly, to a voltage potential monitoring circuit for use therein to monitor the voltage potential and set a voltage potential operating threshold substantially independent of ambient temperature variation.

Contemporary battery operated electronic devices, like paging receivers, for example, generally include a portion of circuitry which may be powered directly at the voltage potential of the battery and another portion for performing digital computations, for example, which require an operating voltage potential substantially higher than that of the battery. For producing this higher voltage potential, the electronic devices generally employ a DC-DC voltage converter/regulator. The battery and higher voltage potentials are commonly referred to as B+ and B++, respectively.

In order to conserve the power drain on the battery and increase the operating life thereof, the higher voltage potential B++ is regulated critically close to the minimum operating voltage potential of the digital computing circuits. Because of this narrow margin, it is of paramount importance to monitor the B++ voltage potential for an undervoltage condition in which the voltage potential is below a predetermined threshold and to prevent the digital computing circuits from entering into invalid states during such period of undervoltage. For this purpose, an undervoltage monitoring circuit is included in the electronic devices for monitoring the B++ voltage potential to detect an undervoltage condition. In a power on state, the undervoltage monitoring circuit is operative to suspend the operation of the digital computing circuits and maintain them at a predetermined initial operating state until the voltage potential B++ reaches an operating threshold. In a monitoring state, the undervoltage monitoring circuit detects when the B++ voltage potential drops below the operating threshold, suspends operation of the digital computing circuits, and maintains the circuits at the predetermined initial operating state until the B++ voltage potential is returned above the operating threshold.

As the designers attempt to seek longer and longer operating battery life, the margin between the regulated B++ voltage potential and the minimum operational threshold is being further reduced to the point where ambient temperature variations may have an adverse affect on both the regulation and monitoring operations, especially when the electronic device is expected to operate over a wide temperature range.

In the past, the B++ voltage regulator was permitted to have a substantial temperature coefficient over the operating temperature range as long as the undervoltage monitoring circuit was designed to operate substantially at the same temperature coefficient and not skewed therefrom. This tracking by temperature coefficients avoids the possible condition where the voltage regulator is generating one voltage potential with temperature, and the monitoring circuit is tripping at a different voltage potential because of the skewing of the temperature coefficients thereof, which condition could lead to either false undervoltage tripping by the monitoring circuit or failure to trip when needed. However, with the reduction in margin between the regulated and minimum operating voltage potentials, it becomes no longer possible to allow the voltage regulator to have a substantial temperature coefficient over the operating temperature range, but rather the regulator is being required to operate at a substantially zero temperature coefficient to ensure the generation of a voltage potential substantially independent of temperature variation. Even with temperature independent voltage regulation, the problems of temperature effects on undervoltage detection have not been completely disposed of because the undervoltage monitoring circuits have temperature coefficients which have not kept up with the temperature independent designs of their associated voltage regulators.

Accordingly, to avoid the conditions of false undervoltage tripping and failure to trip when needed over the full operating temperature range, the undervoltage monitoring circuits must operate in union with the temperature independent voltage regulating circuit. The present invention provides an undervoltage monitoring circuit for achieving this goal.

SUMMARY OF THE INVENTION

A voltage potential monitoring circuit for use in an electronic device operates over an ambient temperature range and includes a source of power for generating a voltage potential suitable for energizing the electronic device. In accordance with the present invention, the monitoring circuit comprises a voltage potential monitoring means for setting a voltage potential threshold substantially independent of ambient temperature variation. The monitoring means includes a first circuit for generating a first current proportional to the voltage potential being monitored, and a second circuit responsive to the first current for generating a second current, the voltage potential threshold being set substantially as a function of the first and second currents. The monitoring circuit further includes means responsive to the first and second currents for generating an undervoltage signal when the monitored voltage potential falls below the set voltage potential threshold.

DETAILED DESCRIPTION OF THE PREFERRED EMBODIMENT

Figure 1:
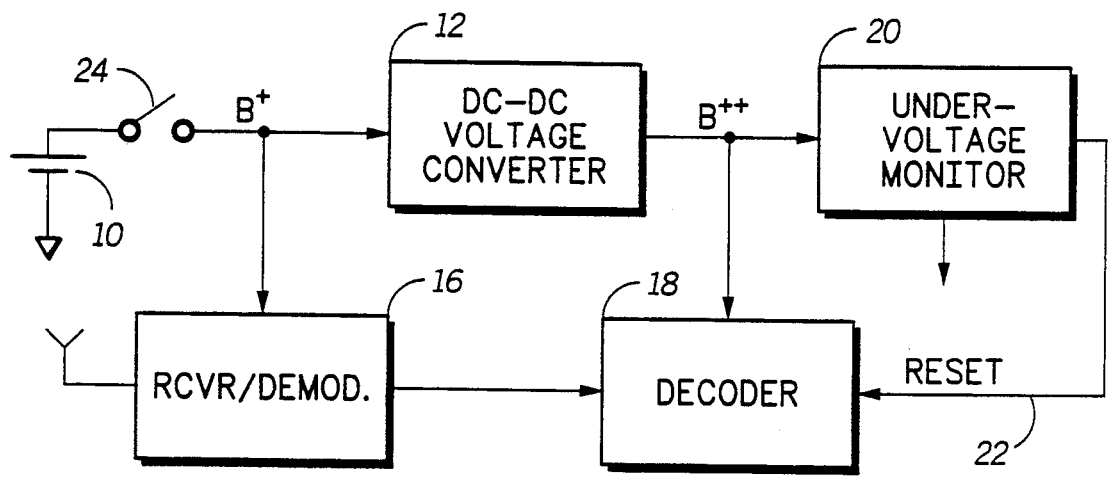
FIG. 1 depicts a block diagram schematic of a battery operated electronic device suitable for embodying the principles of the present invention.

FIG. 1 depicts a block diagram schematic of a paging receiver which is used herein to describe an exemplary embodiment of a battery operated electronic device. Referring to FIG. 1, a conventional battery source 10 which yields a voltage potential on the order of 1-1.3 volts (B+) is coupled to a DC-DC voltage converter 12 which operates to convert the battery voltage potential B+ to a higher voltage potential B++ and regulate the B++ potential at a predetermined value, say on the order of 2.7 volts, for example. In the present example, the battery voltage potential provides power to the receiver and demodulator portion 16 of the electronic device and the voltage potential B++ derived from the battery is the source of power for another portion generally referred to as the controlling circuitry or decoder 18 of the paging receiver. The decoder 18 performs the digital computing and/or processing of data signals received from the circuit portion 16 of the paging receiver. The decoder circuitry 18 generally requires a minimum operating voltage potential, which may be on the order of 2.3 volts, for example, below which it cannot guarantee operation with completely valid states. In one embodiment, the decoder circuitry 18 may include a conventional microprocessor having a reset port. When a reset signal is applied to the reset port, the processing operations of the microprocessor are suspended and it is maintained at a predetermined initial state for commencing processing when the reset signal is relieved.

In accordance with the present invention, an undervoltage monitoring circuit 20 is coupled to the higher voltage potential B++ for monitoring such voltage potential and for setting a voltage potential threshold somewhere between the regulated B++ potential and the minimum operating voltage potential of the decoder circuitry 18 substantially independent of ambient temperature variation. Upon detecting that the regulated B++ voltage is below the preset voltage potential threshold, the monitoring circuit 20 is operative to trip and generate a reset signal over signal line 22 which may be coupled to a microprocessor circuit (reset port) or similar processing circuit of the decoder 18 to suspend the operations of the decoder circuitry and maintain it at a predetermined initial state. The electronic device further includes a power switch 24 which is used to connect and disconnect the battery source 10 from energizing the circuitry of the electronic device.

In operation, when the switch 24 is closed, the voltage converter 12 commences converting the voltage potential B+ to the higher voltage potential B++. During the time that the B++ potential is below the set voltage potential threshold, the monitoring circuit 20 generates the reset signal 22 to the decoder circuitry 18. When the B++ potential reaches and/or exceeds the set voltage potential threshold of the monitoring circuit 20, the reset signal is deactivated and the decoder circuitry 18 is permitted to begin processing from the predetermined initial state. During energization of the electronic device, the B++ potential is monitored by the monitoring circuit 20 for an undervoltage condition, i.e. the regulated voltage potential falling below the set voltage potential threshold thereof. Should this condition occur, the reset signal is reactivated over signal line 22 to again suspend the operation of the controlling circuitry of the decoder 18 and maintain it at the predetermined initial state until the regulated voltage returns to or above the set voltage potential threshold of the monitoring circuit 20.

Figure 2:
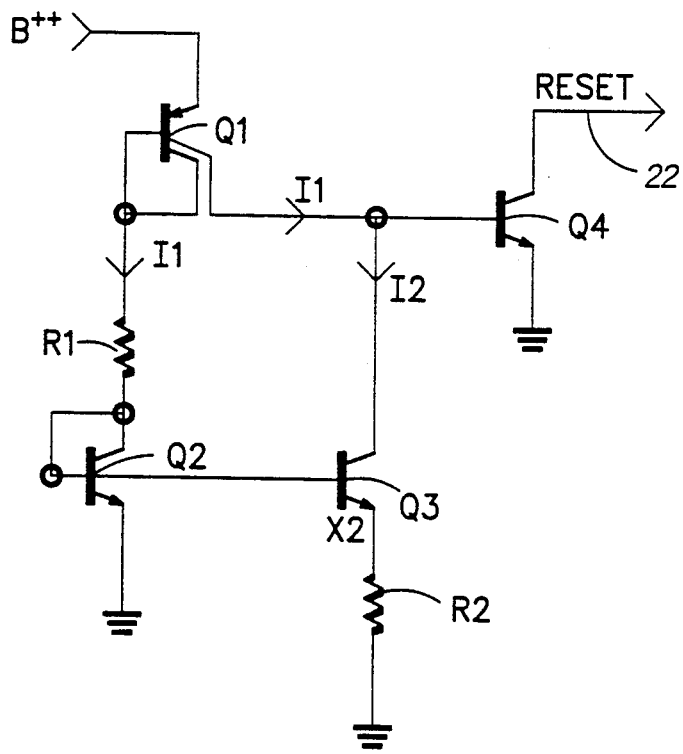
FIG. 2 is a circuit schematic of an undervoltage monitoring circuit suitable for use in the embodiment of FIG. 1.

A suitable embodiment of an undervoltage monitoring circuit 20 is illustrated by the circuit schematic of FIG. 2. Referring to FIG. 2, the regulated voltage potential B++ may be coupled to the emitter of a dual collector PNP transistor Q1. The base and one collector of transistor Q1 may be coupled commonly to one side of a resistor R1 and the other side thereof may be coupled commonly to the base and collector of an NPN transistor Q2. The emitter of the transistor Q2 may be coupled to a fixed voltage potential, such as common or ground potential, for example. The other collector of the transistor Q1 may be coupled to the collector of an NPN transistor Q3 and also to the base of an NPN transistor Q4. The base of transistor Q2 is coupled to the base of transistor Q3 to form a current mirror circuit and the emitter of transistor Q3 is coupled through a series resistor R2 to the fixed voltage potential, which may be ground potential, for example. The emitter of transistor Q4 may be coupled to the fixed voltage potential and the collector thereof may provide the reset signal 22 to the decoder circuitry 18 as shown in FIG. 1.

In operation, the voltage drop across the plurality of semiconductor circuits Q1 and Q2 compositely vary with ambient temperature at a first rate which may be on the order of $-2$ mv per degrees C. times the number of base-emitter junctions in the plurality. The series resistance R1 is selected to have a voltage drop thereacross which varies with ambient temperature at a second rate which substantially offsets the first rate of the plurality of semiconductor circuits Q1 and Q2. If the value of the series resistance R1 is chosen such that the voltage drop thereacross is substantially equated to the composite voltage drops of the emitter-base junctions of the plurality of semiconductor circuits Q1 and Q2, a first current I1 which is conducted through the transistors Q1, Q2 and resistor R1 may be fixed in proportion with the monitored voltage potential B++ substantially independent of temperature over the operating ambient temperature range of the electronic device.

Figure 3:
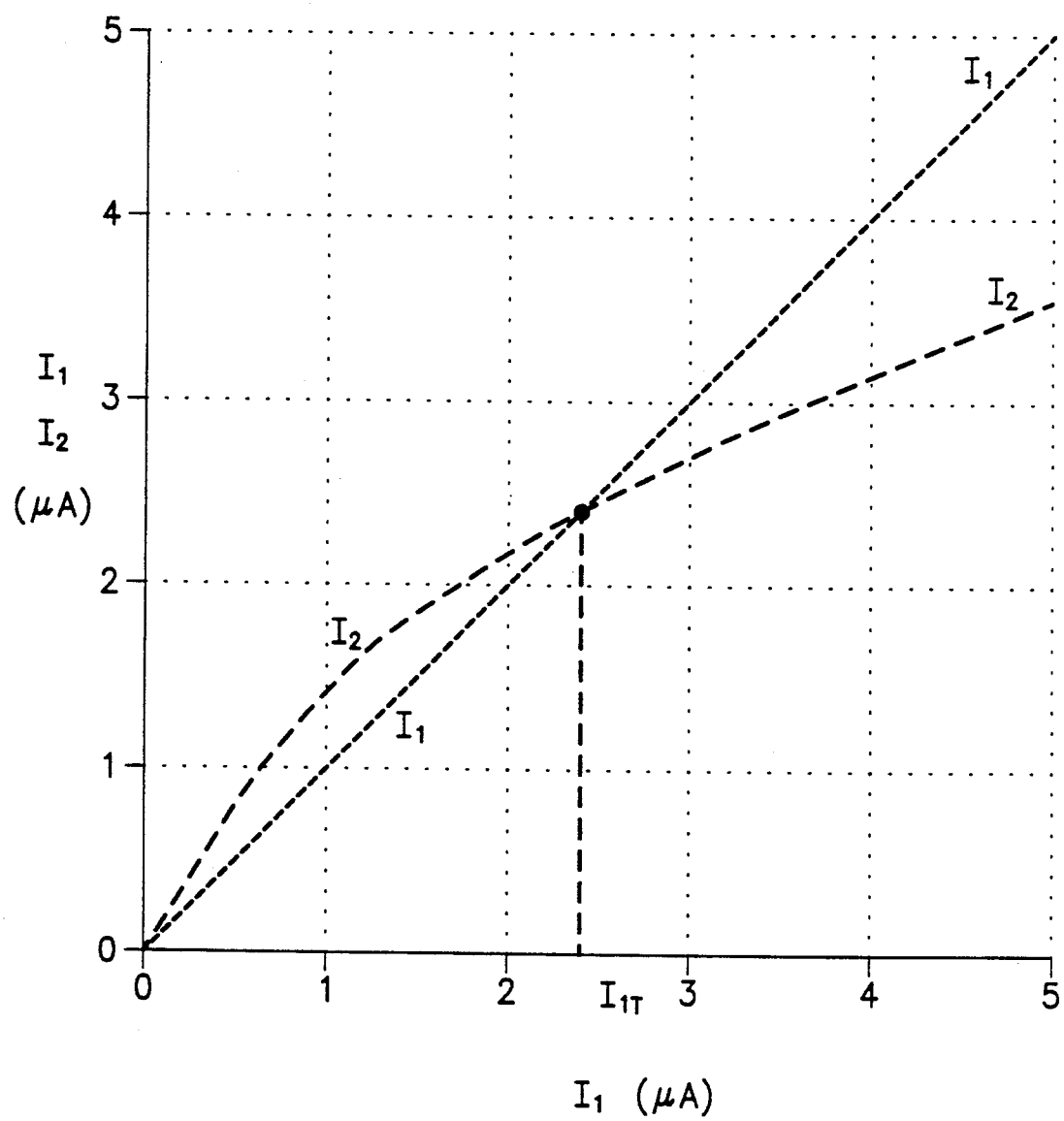
FIG. 3 is a graph exemplifying a current function for use in the design of the current mirror circuit of the embodiment of FIG. 2.

Further, the current mirror circuit including transistors Q2, Q3 and resistor R2 is responsive to the first current I1 to generate a second current I2, which is drawn from the collector-base connection of transistors Q1 and Q4 through the collector-emitter junction of transistor Q3 and resistor R2 to ground, in accordance with a function in which the values of the first and second currents crossover at a predetermined threshold value. An example of such a function is shown in the graph of FIG. 3 where the threshold value (crossover point) is illustrated at $I_{1T}$. In the example shown, the current mirror circuit generates the second current I2 at a value greater than the value of the first current I1 below the threshold value and generates the second current I2 at a value less than the value of the first current I1 above the threshold value. In addition, the second resistance R2 is selected to have a temperature coefficient to offset the temperature coefficient of the transistors of the current mirror circuit, thereby rendering the operation of the current mirror circuit substantially independent of temperature variation over the operating ambient temperature range.

Since the first current is proportional to the regulated voltage potential B++, the setting of the crossover point or threshold value by the design of the current mirror circuit as exemplified by the current function depicted in FIG. 3 correspondingly sets the voltage potential threshold. In addition, since both of the first current I1 and the second current I2 are generated substantially independent of temperature variation, the setting of the voltage potential threshold utilizing these currents is likewise independent of temperature variation.

Still further, in the present embodiment, the undervoltage or reset signal 22 is generated by a current comparing device embodied by transistor Q4 at times when it is in a blocking or non-conductive state. When the second current I2 becomes greater than the first current I1, drive current of Q4 is diverted through transistor Q3 rendering Q4 non-conductive. As shown by the graph of FIG. 3, this condition arises when the first current I1 which is proportional to the regulated potential B++ falls below the set threshold value $I_{1T}$.

Figures 4A, 4B, 4C:
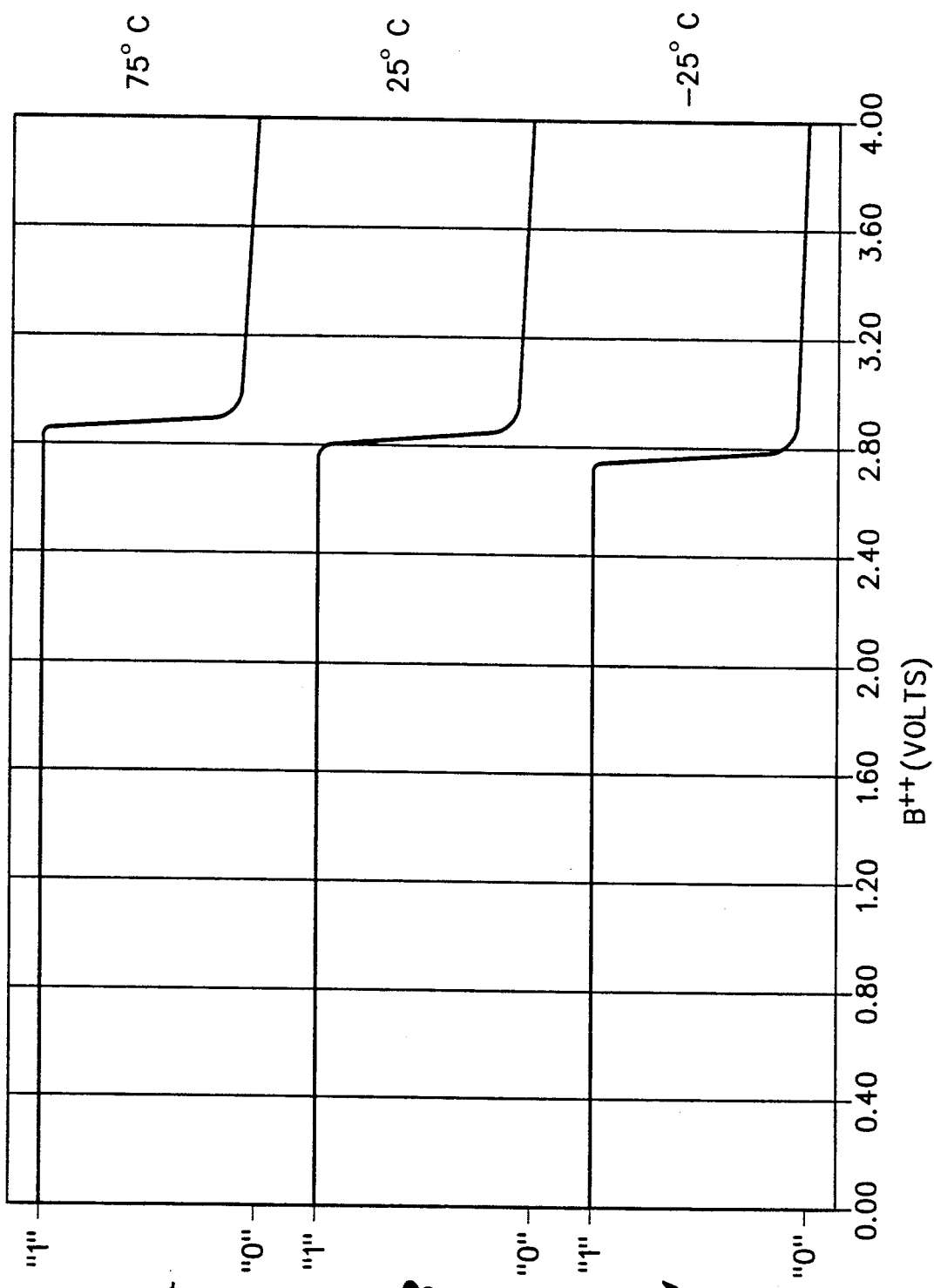
FIG. 4 includes waveforms 4A, 4B and 4C illustrating the tripping operation of an undervoltage monitoring circuit over a range from −25° C. to 75° C.

The waveforms 4A, 4B and 4C of FIG. 4 illustrate the tripping operation of the undervoltage monitoring circuit 20 over a range from −25° C. to 75° C. It is recognized that less than 100 mv change in voltage potential threshold occurred under these test conditions.

While the present invention has been described above using only one embodiment, it is understood that modifications, additions and substitutions may be made to the embodiment or equivalent embodiments used without deviating from the principles of the present invention. Accordingly, the present invention should not be limited to any specific embodiment, but rather construed in accordance with the breadth and broad scope recited in the appended claims.

What is claimed is:

1. A battery-operated electronic device operational over an ambient temperature range and including a battery derived source of power for generating a voltage potential suitable for energizing at least a controlling circuit portion of said electronic device which is sensitive to the voltage potential for valid operation, said electronic device comprising:

means for monitoring said voltage potential, said monitoring means for setting a voltage potential threshold substantially independent of ambient temperature variation including:

first circuit means for generating a first current proportional to the voltage potential being monitored;

second circuit means coupled to the first circuit means and responsive to said first current for generating a second current in the second circuit means, said voltage potential threshold being set at a level where said first and second currents are substantially equal; and means responsive to said first and second currents for generating an undervoltage signal when the monitored voltage potential falls below the set voltage potential threshold, said undervoltage signal being coupled to said controlling circuit portion or suspending the operation thereof.

2. The electronic device in accordance with claim 1 wherein the first circuit means includes:

a plurality of semiconductor circuits coupled in series between the voltage potential being monitored and a fixed voltage potential, the voltage drop across said plurality of semiconductor circuits compositely varying with temperature at a first rate; and a first resistor coupled in series with said plurality of semiconductor circuits and selected to have the voltage drop thereacross vary with temperature at a second rate which substantially offsets said first rate.

3. The electronic device in accordance with claim 1 wherein the second circuit means includes a current means includes a current mirror circuit responsive to the first current to generate the second current in accordance with a function for varying the values of the first and second currents to enable the first and second currents to be substantially equal at a level for determining a threshold value.

4. The electronic device in accordance with claim 3 wherein the current mirror circuit is responsive to the first current to generate the second current at a value greater than the value of the first current below the threshold value and to generate the second current at a value less than the value of the first current above the threshold value.

5. The electronic device in accordance with claim 3 wherein the current mirror circuit includes a second resistor which is selected to have a temperature coefficient to offset the temperature coefficient of the current mirror circuit, thereby rendering the operation of the second circuit means substantially independent of temperature variation.

6. The electronic device in accordance with claim 1 wherein the first circuit means includes: a dual collector PNP transistor having the emitter thereof coupled to the voltage potential being monitored, one collector thereof coupled to its base and the other collector thereof coupled to the undervoltage signal generating means; a first NPN transistor having the collector thereof coupled to its base and the emitter thereof coupled to a fixed voltage potential; and a first resistor coupled between the one collector of the PNP transistor and the collector of the NPN transistor.

7. The electronic device in accordance with claim 6 wherein the second circuit means includes the first NPN transistor; a second NPN transistor having the base thereof coupled to the base of the first NPN transistor, the emitter thereof coupled to a fixed voltage potential and the collector thereof coupled to the other collector of the PNP transistor; and a second resistance coupled between the emitter of the second NPN transistor and the fixed voltage potential.

8. The electronic device in accordance with claim 1 wherein the controlling circuit portion includes a microprocessor having a reset input; and wherein the undervoltage signal is coupled to the reset input of the microprocessor.

9. A voltage potential monitoring circuit for use in an electronic device operational over an ambient temperature range and including a source of power for generating a voltage potential suitable for energizing the electronic device, said monitoring circuit comprising:

means for monitoring said voltage potential, said monitoring means for setting a voltage potential threshold substantially independent of ambient temperature variation and including:

first circuit means for generating a first current proportional to the voltage potential being monitored;

second circuit means coupled to the first circuit means and responsive to said first current for generating a second current in the second circuit means, said voltage potential threshold being set at a level where said first and second currents are substantially equal; and means responsive to said first and second currents for generating an undervoltage signal when the monitored voltage potential falls below the set voltage potential threshold.

10. The monitoring circuit in accordance with claim 9 wherein the first circuit means includes:

A plurality of semiconductor circuits coupled in series between the voltage potential being monitored and a fixed voltage potential, the voltage drop across said plurality of semiconductor circuits compositely varying with temperature at a first rate; and a first resistor coupled in series with said plurality of semiconductor circuits and selected to have the voltage drop thereacross vary with temperature of a second rate which substantially offsets said first rate.

11. The monitoring circuit in accordance with claim 9 wherein the second circuit means includes a current mirror circuit responsive to the first current to generate the second current in accordance with a function for varying the values of the first and second currents to enable the first and second currents to be substantially equal at a level for determining a threshold value.

12. The monitoring circuit in accordance with claim 11 wherein the current mirror circuit is responsive to the first current to generate the second current at a volume greater than the value of the first current below the threshold value and to generate the second current at a value less than the value of the first current above the threshold value.

13. The monitoring circuit in accordance with claim 11 wherein the current mirror circuit includes a second resistor which is selected to have a temperature coefficient to offset the temperature coefficient of the current mirror circuit, thereby rendering the operation of the second circuit means substantially independent of temperature variation.

14. The monitoring circuit in accordance with claim 9 wherein the first circuit means includes: a dual collector PNP transistor having the emitter thereof coupled to the voltage potential being monitored, one collector thereof coupled to its base and the other collector thereof coupled to the undervoltage signal generating means; a first NPN transistor having the collector thereof coupled to a fixed voltage potential; and a first resistor coupled between the one collector of the PNP transistor and the collector of the NPN transistor.

15. The monitoring circuit in accordance with claim 14 wherein the second circuit means includes the first NPN transistor; a second NPN transistor having the base thereof coupled to the base of the first NPN transistor, the emitter thereof coupled to a fixed voltage potential and the collector thereof coupled to the other collector of the PNP transistor; and a second resistor coupled between the emitter of the second NPN transistor and the fixed voltage potential.

* * * * *